United States Patent [19]
Guggenberger

[11] Patent Number: 6,149,759
[45] Date of Patent: Nov. 21, 2000

[54] PROCESS AND DEVICE FOR ONE-SIDED TREATMENT OF DISK-SHAPED OBJECTS

[75] Inventor: Gunther Guggenberger, Spittal an der Drau, Austria

[73] Assignee: SEZ Semiconductor-Equipment Zubehor fur die Halbleiterfertigung AG, Villach, Austria

[21] Appl. No.: 09/038,288

[22] Filed: Mar. 11, 1998

[30] Foreign Application Priority Data

Mar. 26, 1997 [AT] Austria ........................................ 527/97

[51] Int. Cl.[7] ................................................ H01L 21/302
[52] U.S. Cl. ............................ 156/345; 438/706; 438/716
[58] Field of Search ...................................... 438/706, 710, 438/712, 716; 156/345, 639, 640; 134/1.1, 33, 7.2

[56] References Cited

U.S. PATENT DOCUMENTS

| | | | |
|---|---|---|---|
| 4,165,252 | 8/1979 | Gibbs | 156/655 |
| 4,350,562 | 9/1982 | Bonii | 156/639 |
| 5,100,495 | 3/1992 | Ohmi et al. | 156/345 |
| 5,478,401 | 12/1995 | Tsunekawa et al. | 134/1 |
| 5,580,421 | 12/1996 | Hiatt et al. | 150/643.1 |

FOREIGN PATENT DOCUMENTS 35 22 465   1/1986   Germany .

*Primary Examiner*—Benjamin L. Utech
*Assistant Examiner*—Lan Vinh
*Attorney, Agent, or Firm*—Young & Thompson

[57] ABSTRACT

For one-sided etching of silicon wafer 8 in the dry-etching process, a device is provided that consists of a cap-shaped housing 1 and a holding plate 7, attached to the latter, for silicon wafer 8 that is to be etched in a process chamber 5, into which a medium in gaseous form that exerts an etching action can be introduced. In holding plate 7 is an indentation 9, around which holding pins 11 for silicon wafer 8 and suction openings 12 are arranged to remove gas from process chamber 5. Silicon wafer 8 that is to be treated is placed with its side 20 that is to be etched upward on holding plate 7, and a medium in gaseous form that is inert with respect to the layer that is to be removed by etching is introduced into indentation 9 in holding plate 7.

7 Claims, 2 Drawing Sheets

PROCESS AND DEVICE FOR ONE-SIDED TREATMENT OF DISK-SHAPED OBJECTS

FIELD OF THE INVENTION

The invention relates to a process and a device for one-sided treatment of disk-shaped objects, for example for dry-etching of silicon wafers, of which a layer that is present on both sides, e.g., an oxide layer, is to be removed only on one side.

The invention further relates to a device with which the process of the invention can be implemented.

BACKGROUND OF THE INVENTION

Wet-etching devices are known with which disk-shaped objects, especially silicon wafers, are treated with a liquid etching medium to remove by etching a layer that is present on the disk-shaped object, e.g., an oxide layer on a silicon wafer.

Processes and devices are also known for etching wafers with an etching medium in gaseous form (dry etching). For example, an oxide layer of silicon wafers is removed by treating the wafer with hydrogen fluoride that is dissolved in nitrogen (HF vapors).

From DE 35 22 465 A it is known to protect a silicon wafer that is treated with a liquid etching medium on its underside by flushing it with deionized water before an etching attack. DE 35 22 465 A also mentions a ring gap, but this ring gap is determined by the geometric dimensions of a disk-shaped element and the wafer-side end of a supporting element. In the known device, the wafer is secured by separately applied negative pressure on the supporting element.

SUMMARY OF THE INVENTION

The object of the invention is to indicate a process and a device for implementing the process which ensure that the treatment medium that acts on one side of the disk-shaped object cannot act on the other side of the object that is not to be treated, or cannot do so in an uncontrolled manner.

The invention further relates to a device that can preferably be used to implement the process according to the invention and that has the features of the main claim of the device.

Preferred and advantageous configurations of the process according to the invention and the device according to the invention are the objects of the subclaims.

Since, in the process according to the invention, the surface of the disk-shaped object, e.g., the silicon wafer, that is not to be treated is blown with an inert medium in gaseous form, the treatment medium in gaseous form is reliably prevented from acting in an uncontrolled manner on the surface of the disk-shaped object that is not to be treated, e.g., beyond an edge area.

BRIEF DESCRIPTION OF THE DRAWINGS

Other details and features of the process according to the invention and the device according to the invention follow from the following description, in which reference is made to the associated drawing. Here.

DETAILED DESCRIPTION OF THE INVENTION

Although reference is made in the following description to etching for removing an oxide layer on a silicon wafer, the invention is not limited to this sample application. This use is preferred, however.

Figure 1:
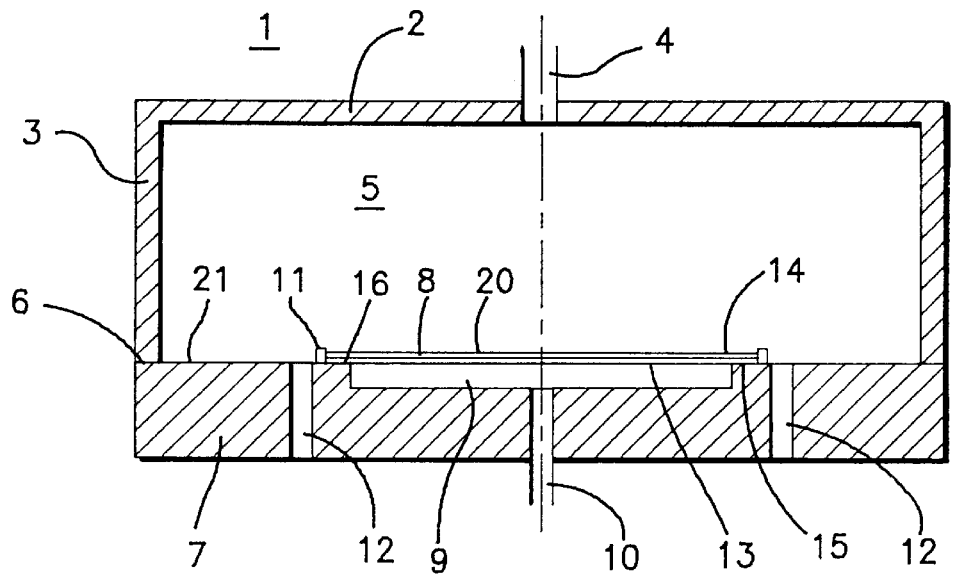
FIG. 1 in axial section diagrammatically shows a device that is suitable for implementing the process according to the invention.

The device that is shown in FIG. 1 consists of a lower open housing 1 with a cover wall 2 and a side wall 3, which is designed in the shape of, for example, a bell. Above, housing 1 has a connection 4 for supplying the treatment medium in gaseous form, e.g., a dry-etching medium (e.g., hydrogen fluoride that is dissolved in nitrogen, to process chamber 5 that is enclosed by housing 1. A holding plate 7 for object 8 that is to be treated, for example a silicon wafer, is connected in a detachable manner to free edge 6 of side wall 3 of cap-shaped housing 1.

Holding plate 7 has an indentation 9, in which a pipe 10 for supplying a medium in gaseous form ends, which with respect to the layer that is to be removed, e.g., the oxide layer that is to be removed on a silicon wafer, does not have any etching action, i.e., is inert in this respect. For example, this gas can be nitrogen.

In an embodiment (not shown) of the device according to the invention that is suitable for treating several disk-shaped objects 8 simultaneously, several indentations 9 of the type described here are provided in metal plate 7. Associated with each indentation 9 is a pipe 10, through which inert medium in gaseous form can be supplied to indentations 9.

Figure 2:
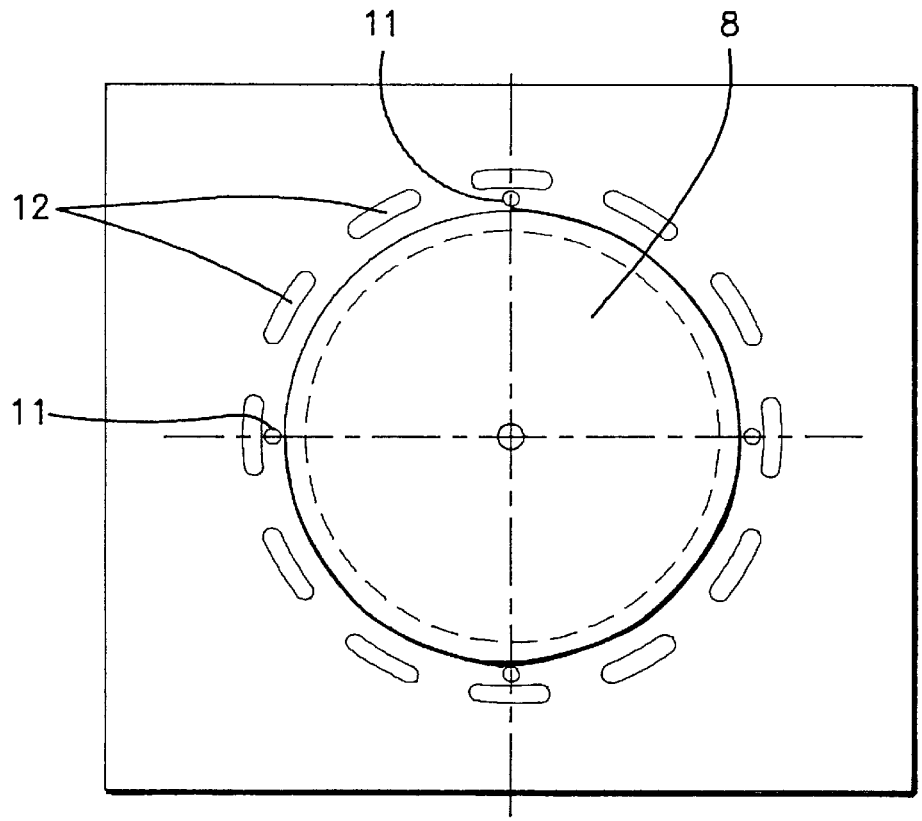
FIG. 2 shows the plate on which the disk-shaped object is held, in top view.

Several, preferably four, pins 11 that project upward are provided in holding plate 7 all around indentation 9 and surround the area of holding plate 7, in which disk-shaped object 8 that is to be treated is put on holding plate 7. Outside indented area 9 and outside of pins 11 and in the embodiments shown in FIGS. 1 and 2, several suction openings 12 are provided around indentation 9 to remove the etching medium in gaseous form and the inert medium in gaseous form that is supplied through pipe 10. Openings 12, as shown in FIG. 2, can have, for example, the outlines of arc-shaped slits. The embodiment that is shown in FIGS. 1 and 2 is preferably used when side 13 of disk-shaped object 8 that faces holding plate 7 is to be protected completely against the action of the treatment medium.

Figure 3:
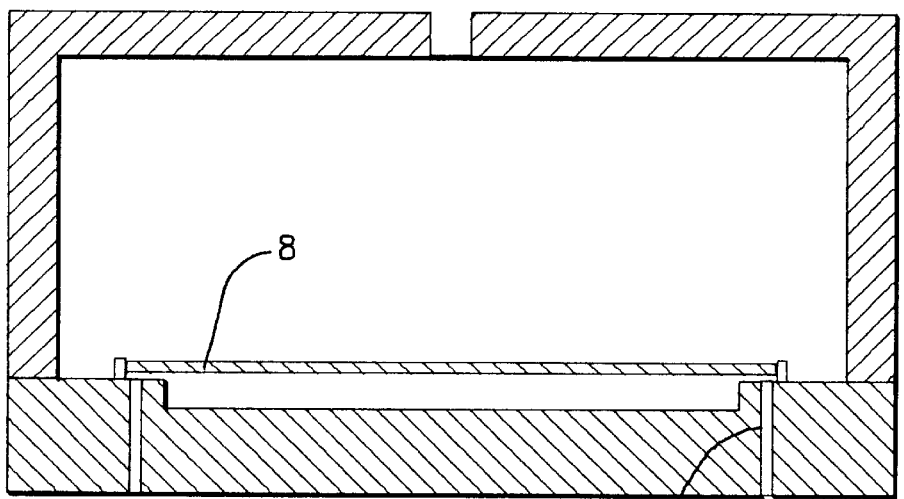
FIGS. 3 and 4 show another embodiment.
Figure 4:
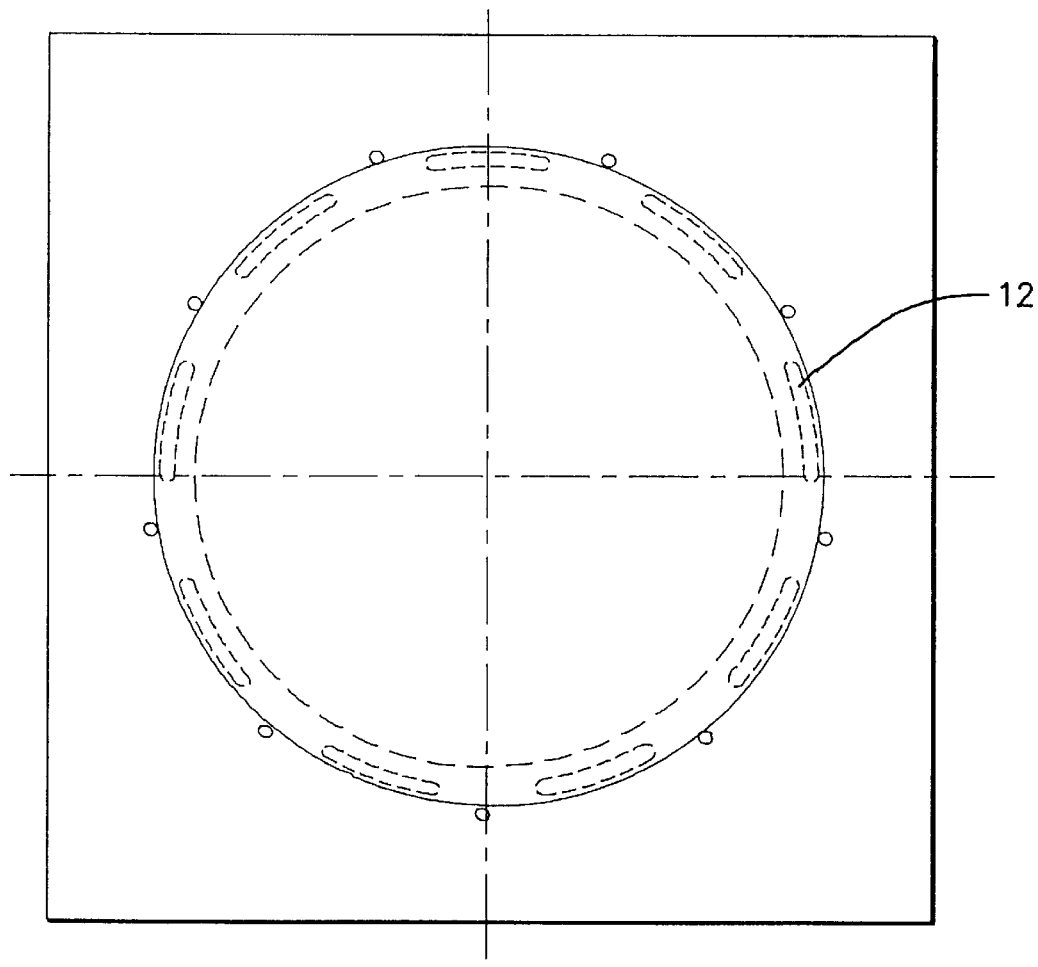

The embodiment of the device according to the invention that is shown in FIGS. 3 and 4 is especially used if the edge area of the side, facing holding plate 7, of disk-shaped object 8 is to be exposed to the action of the treatment medium in a controlled manner. For example, when the embodiment that is shown in FIGS. 3 and 4 is used, an oxide layer that is defined in the edge area of lower side 13 can be removed from a silicon wafer by etching. The embodiment that is shown in FIGS. 3 and 4 is distinguished from that in FIGS. 1 and 2 in that suction openings 12 are arranged in the area of holding plate 7 that is overlapped by the edge of disk-shaped object 8.

When the device is used, object 8 that is to be treated, for example a silicon wafer with surface 13 that is not to come into contact at all with the treatment medium, for example ($N_2$+HF) (especially if the embodiment of FIGS. 1 and 2 is used) or only in a defined edge area, which thus is to not to be etched or is not to be etched in an uncontrolled manner, is placed facing downward on holding plate 7 in the area of indentation 9 that is provided in it inside pins 11 that project upward.

If the inert medium in gaseous form, e.g., nitrogen, is blown into indentation 9 through pipe 10 in holding plate 7, edge 14 of object 8 is raised somewhat from edge 15 of indentation 9, i.e., from the upper side of holding plate 7, by the flowing medium in gaseous form, in such a way that a ring gap 16 forms and lower side 13 of disk-shaped object 8 that is suspended over holding plate 7 is flushed with the inert medium in gaseous form. An etching medium in gaseous form, for example ($N_2$+HF), is introduced via pipe 4 that is connected to cap-shaped housing 1, in such a way that side 20 of object 8 that faces away from holding plate 7 is etched, for example, to remove an oxide layer that is provided on the silicon wafer.

Since the inert medium in gaseous form flows out through nozzle-like ring gap 16 between object 8 that is slightly raised from holding plate 7 and upper side 21 of holding plate 7, it is ensured that the etching medium in gaseous form either does not reach lower side 13 of object 8 at all (especially if the embodiment of FIGS. 1 and 2 is used) or that the etching medium in gaseous form acts only in a carefully defined edge area of side 13 of disk-shaped object 8 that faces toward holding plate 7 (especially if the embodiment of FIGS. 3 and 4 is used), so that etching is done there in a defined manner.

In the area of nozzle-like ring gap 16, which is bounded in the upward direction by edge 14 of object 8 and in the downward direction by edge 15 of indentation 9 in holding plate 7, the Bernoulli effect sets in when the inert gas flows out through ring gap 16, so that without any further effort disk-shaped object 8 is kept from being blown away from holding plate 7 by the inert gas, even though it is suspended over the holding plate.

Both the etching medium in gaseous form, which etches upper side 20 of object 8, and the inert medium in gaseous form, which flushes lower side 13 of object 8, are drained off from process chamber 5 via suction openings 12 that are provided around indentation 9 in holding plate 7.

As soon as the etching process has been completed, process chamber 5 is flushed with an inert, gaseous medium, e.g., pure nitrogen, and then holding plate 7 is removed from cap-shaped housing 1 and, for example, another holding plate 7, on which an object 8 that is to be treated is placed, is brought into position with regard to cap-shaped housing 1, whereupon another etching process can be carried out.

In summary, a preferred embodiment of the invention can be described as follows:

For one-sided etching of silicon wafers 8 in the dry-etching process, a device is provided that consists of a cap-shaped housing 1 and a holding plate 7, attached to the latter, for silicon wafer 8 that is to be etched. Cap-shaped housing 1 and holding plate 7 that is attached to it surround a process chamber 5, into which a medium in gaseous form that exerts an etching action, e.g., a mixture of nitrogen and hydrogen fluoride, can be introduced. In holding plate 7 is an indentation 9, around which holding pins 11 for silicon wafers 8 and suction openings 12 are arranged to remove gas from process chamber 5. Silicon wafer 8 that is to be treated is placed with its side 20 that is to be etched upward on holding plate 7, and a medium in gaseous form that is inert relative to the layer that is to be removed by etching is introduced into indentation 9 in holding plate 7. As a result, silicon wafer 8 is raised from edge 15 of indentation 9 in holding plate 7, in such a way that a ring gap 16 is created, from which the inert medium in gaseous form can flow out between holding plate 7 and silicon wafer 8. The etching medium that is blown into process chamber 5 flushes surface 20 of silicon wafer 8 that faces away from holding plate 7 and cannot reach surface 13 of silicon wafer 8 that faces holding plate 7, or cannot do so in an uncontrolled manner, because of the inert gas that comes out through ring gap 16 between silicon wafer 8 and holding plate 7, in such a way that subetching is also prevented in the edge area of silicon wafer 8 or is carried out only in a defined edge area.

What is claimed is:

1. Apparatus for treating a disk-shaped object, which comprises:

a cap-shaped housing part and a holding plate which together define a processing chamber;

said housing part including a first pipe for introducing a gaseous etching medium into said processing chamber;

said holding plate having at least one indentation for supporting a disk-shaped object having a layer to be etched, and a second pipe for introducing a gaseous medium into said indentation; said gaseous medium being inert with respect to the layer to be etched;

said indentation being circumscribed by an outer peripheral wall having an upper surface;

said disk-shaped object having an outer peripheral lower surface adapted to engage the upper surface of the indentation, such that said indentation is smaller than the disk-shaped object; and wherein a nozzle-shaped ring gap is provided between a peripheral edge of the disk-shaped object and a surface area of the holding plate that surrounds the indentation.

2. Apparatus according to claim 1, wherein the cap-shaped housing part has a free edge which is detachably connected to the holding plate.

3. Apparatus according to claim 1, wherein the holding plate further comprises pins which surround the indentation.

4. Apparatus according to claim 1, wherein the holding plate further comprises openings for removing gaseous media introduced into the process chamber; said openings being positioned around the indentation.

5. Apparatus according to claim 3, wherein the holding plate further comprises openings for removing gaseous media introduced into the process chamber; said openings being positioned around the indentation.

6. Apparatus according to claim 5, wherein the openings are arranged radially outwardly of the pins.

7. Apparatus according to claim 5, wherein the openings are arranged radially inwardly of the pins.

* * * * *